United States Patent
Yamamoto et al.

(10) Patent No.: US 7,987,886 B2
(45) Date of Patent: Aug. 2, 2011

(54) PROTECTIVE TAPE JOINING APPARATUS

(75) Inventors: Masayuki Yamamoto, Ibaraki (JP); Yasuji Kaneshima, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 180 days.

(21) Appl. No.: 12/429,419

(22) Filed: Apr. 24, 2009

(65) Prior Publication Data
US 2009/0272496 A1    Nov. 5, 2009

(30) Foreign Application Priority Data

May 2, 2008 (JP) ................................. 2008-120574

(51) Int. Cl.
*B32B 43/00* (2006.01)
(52) U.S. Cl. ....................................... 156/522; 156/510
(58) Field of Classification Search .................. 156/510, 156/522, 584
See application file for complete search history.

(56) References Cited

U.S. PATENT DOCUMENTS

| 5,472,554 A * | 12/1995 | Ko et al. | 156/361 |
| 5,688,354 A * | 11/1997 | Ko et al. | 156/267 |
| 2009/0151875 A1* | 6/2009 | Nonaka et al. | 156/510 |

FOREIGN PATENT DOCUMENTS

JP   2004-47976 A   2/2004
WO   WO 2007049441 A1 *   5/2007
* cited by examiner

*Primary Examiner* — Khanh Nguyen
*Assistant Examiner* — John Blades
(74) *Attorney, Agent, or Firm* — Cheng Law Group, PLLC

(57) ABSTRACT

A chuck table is configured with a table main body having a wafer placement part holding a wafer placed thereon, and an annular tape support frame provided outside the wafer placement part with a cutter blade traveling groove being interposed therebetween. The tape support frame has, at a top face thereof, a plurality of linear grooves arranged in parallel in a tape joining direction, a large number of linear tape support parts each located between the linear grooves, and an annular tape support part supporting the protective tape at an outer side of the cutter blade traveling groove.

4 Claims, 12 Drawing Sheets

PROTECTIVE TAPE JOINING APPARATUS

BACKGROUND OF THE INVENTION (1) Field of the Invention

This invention relates to a protective tape joining apparatus that joins a protective tape to a surface of a semiconductor wafer subjected to surface treatment and cuts the protective tape along an outer periphery of the semiconductor wafer.

(2) Description of the Related Art

In order to join a protective tape to a surface of a semiconductor wafer (hereinafter, appropriately referred to as a "wafer") and then cut the protective tape, there has been known a device having the following configuration. For example, such a device is configured with a chuck table and an annular frame member that surrounds the chuck table. Specifically, the wafer is placed on and held by the chuck table and the protective tape is supplied onto the surface of the wafer. Next, a joining roller rolls on a surface of the protective tape to join the protective tape to the surface of the wafer and the frame member. Next, a cutter blade travels on a cutter blade traveling groove formed on a top face of the chuck table while piercing through the protective tape. Thus, the protective tape is cut along an outer periphery of the wafer (refer to JP 2004-047976 A).

A protective tape joining apparatus having the configuration described above has the following problem. That is, in a case where an unnecessary tape after cut out is separated from the protective tape, the unnecessary tape disadvantageously comes into close contact with the frame member because of a flat surface of the frame member, and, consequently, cannot be removed from the frame member with ease. In order to avoid such a disadvantage, there has been proposed a frame member the surface of which has a releasing property for removing an unnecessary tape therefrom with ease.

However, there are various protective tapes which are different in adhesive force from one another. Consequently, there arises such a disadvantage that various frame members with different releasing properties must be prepared previously depending on the types of the protective tapes.

In the conventional chuck table, moreover, the surface of the wafer placed on a wafer placement part is flush with the surface of the frame member. Therefore, the protective tape is joined to the surface of the wafer and a surface of a tape support frame with no height difference. In other words, various frame members with different thicknesses must be prepared previously in order to handle various wafers with different thicknesses and must be selectively used depending on a thickness of a semiconductor wafer to be handled herein. Consequently, there arise the following disadvantages. That is, each time a semiconductor wafer to be handled herein is replaced with a semiconductor wafer which is different in thickness from the semiconductor wafer, a frame member of the protective tape joining apparatus is also replaced with a different frame member depending on the thickness of the replaced semiconductor wafer at much expense in time and effort. Further, various frame members must be prepared and stored.

SUMMARY OF THE INVENTION

An object of this invention is to cut a protective tape along an outer periphery of a semiconductor wafer with good finished quality while applying appropriate tension to an unnecessary portion of the protective tape protruding from the semiconductor wafer and to separate the unnecessary protective tape from a chuck table with ease.

This invention provides a protective tape joining apparatus including:

a holding table having a cutter blade traveling groove and holding a semiconductor wafer placed thereon;

a joining roller rolling on a protective tape to join the protective tape to a surface of the semiconductor wafer; and a cutter blade piercing through the protective tape, traveling on the cutter blade traveling groove along an outer periphery of the semiconductor wafer, and cutting the protective tape joined to the surface of the semiconductor wafer along a contour of the semiconductor wafer, wherein the holding table includes a table main body having a wafer placement part holding the semiconductor wafer placed thereon, and an annular tape support frame provided outside the wafer placement part with the cutter blade traveling groove being interposed therebetween, and the tape support frame has, at a top face thereof, a plurality of linear grooves arranged in parallel in a tape joining direction, a plurality of linear tape support parts each located between the two linear grooves, and an annular tape support part supporting the protective tape at an outer side of the cutter blade traveling groove.

According to the protective tape joining apparatus of the present invention, in order to join the supplied protective tape to the semiconductor wafer and a wafer support part, the joining roller rolls on the protective tape along the plurality of linear tape support parts of the tape support frame. That is, the joining roller rolls on the protective tape smoothly while keeping a certain height, without getting caught in the linear grooves each located between the linear tape support parts.

Accordingly, the protective tape is uniformly joined to and supported by the plurality of linear tape support parts while being pressed against the surfaces of the respective linear tape support parts by a fixed pressing force.

Moreover, a contact area of the protective tape with the plurality of linear tape support parts of the tape support frame is smaller than an area of the tape support frame. Further, the protective tape is joined and supported such that the joining surfaces thereof are arranged in parallel in one direction to form a linear shape.

Accordingly, the cut protective tape is separated starting from one end of the linear shape, that is, the joining starting position or the joining termination position. Thus, the protective tape can be readily separated and removed from the tape support frame.

At the outer side of the cutter blade traveling groove, further, the protective tape is continuously joined to and supported by the annular tape support part of the tape support frame so as to surround the outer periphery of the wafer. Therefore, the protective tape on the cutter blade traveling groove is in such a state that tension is applied thereto uniformly throughout the circumference of the cutter blade traveling groove. In the tape cutting process, accordingly, the protective tape, to which the tension is applied uniformly, is cut by the cutter blade traveling on the cutter blade traveling groove uniformly without being shifted.

In this apparatus, preferably, an annular groove is formed outside the annular tape support part as a vacuum-suction groove.

With this configuration, the protective tape on the annular groove is sucked into the annular groove by action of vacuum suction. Therefore, the protective tape is strongly pressed against the annular tape support part.

Accordingly, the state that the tension is applied to the protective tape on the cutter blade traveling groove becomes more reliable and uniform in the circumferential direction. Thus, the protective tape can be cut along the cutter blade traveling groove with good accuracy.

In this configuration, preferably, the tape support frame is coupled to the table main body such that a height thereof is adjustable relative to the wafer placement part.

With this configuration, when the height of the tape support frame is changed and adjusted depending on a thickness of the wafer, the surface of the wafer placed on and held by the wafer placement part can be made flush with the surface of the tape support frame.

Accordingly, the protective tape can be joined smoothly to the tape support frame and the wafer with no height difference therebetween.

In this configuration, the table main body has two sets of attachment seat parts which are different in height from each other, the tape support frame has coupling parts mounted on and coupled to the attachment seat parts, respectively, and when the tape support frame is directed in a reverse direction relative to the joining roller rolling direction, the coupling parts face one of the two sets of attachment seat parts.

With this configuration, by merely changing the position of the tape support frame coupled to the table main body in a reverse direction, the height of the surface of the tape support frame can be changed and adjusted depending on a thickness of the wafer while the direction of the linear tape support part relative to the tape support frame matches with the joining roller rolling direction.

Accordingly, there is no need to prepare previously a plurality of tape support frames which are different in surface height from one another.

In this configuration, preferably, the coupling part of the tape support frame is made of a heat insulating material and is different in material from the tape support frame.

With this configuration, in a case where a heater is incorporated in the table main body to apply heat to the semiconductor wafer placed on the wafer placement part so as to increase a protective tape joining strength, the coupling part can interrupt heat conduction from the table main body to the tape support frame.

Accordingly, it is possible to prevent the tape support frame from being subjected to heat and to avoid such a disadvantage that the protective tape cannot be separated and removed with ease from the tape support frame due to the increased joining strength thereof.

In this configuration, preferably, the holding table further includes a shim plate to be inserted between the coupling part and the attachment seat part which are coupled by a bolt, and the shim plate has a slit through which the bolt penetrates when the shim plate is inserted between the coupling part and the attachment seat part.

With this configuration, the shim plate can be inserted/removed without removal of the bolt. That is, the height of the chuck table can be changed with ease in the state that the coupling part and the attachment seat part are coupled by the bolt.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

With reference to the drawings, hereinafter, description will be given of preferred embodiments of this invention.

Figure 1:
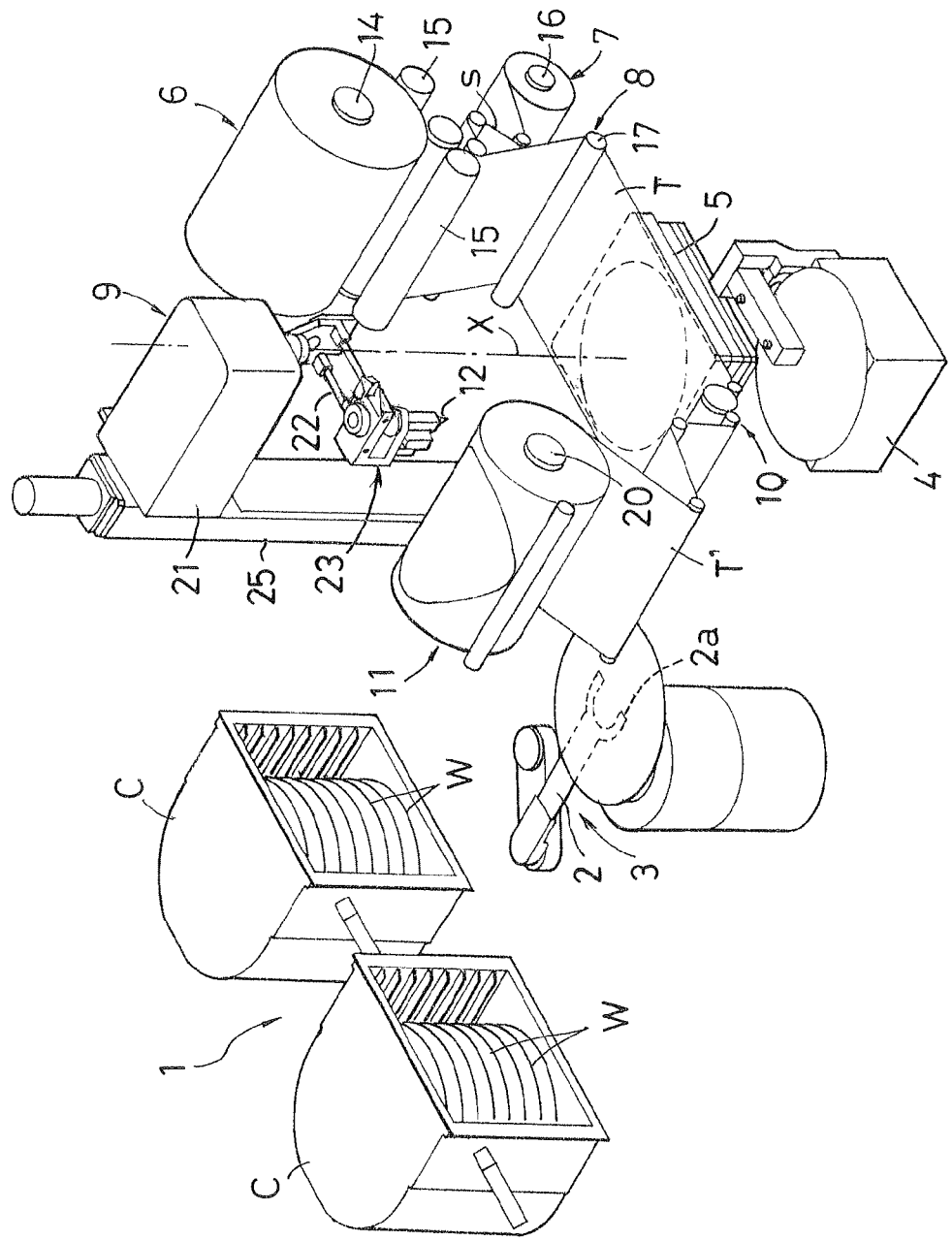
FIG. 1 is a perspective view showing a general configuration of a protective tape joining apparatus.

FIG. 1 is a perspective view showing a general configuration of a protective tape joining apparatus.

This protective tape joining apparatus includes: a wafer supply/collection part 1 with a cassette C mounted therein for housing a semiconductor wafer (hereinafter, simply referred to as a "wafer") W; a wafer transport mechanism 3 that has a robot arm 2; an alignment stage 4; a chuck table 5 that suction-holds the wafer W placed thereon; a tape supply part 6 that supplies a protective tape T provided with a separator s onto a position above the wafer W; a separator collection part 7 that separates the separator from the protective tape T supplied from the tape supply part 6 and collects the separator s; a joining unit 8 that joins the protective tape T to the wafer W placed on and suction-held by the chuck table 5; a tape cutting device 9 that cuts out the protective tape T joined to the wafer W along a contour of the wafer W; a separation unit 10 that separates an unnecessary tape T', which is a portion of the cut protective tape T joined to the wafer W, from the protective tape T; a tape collection part 11 that winds and collects the unnecessary tape T' separated by the separation unit 10; and others. Hereinafter, description will be given of detailed configurations of the respective structural parts and mechanisms.

The wafer supply/collection part 1 is configured with two cassettes C arranged in parallel. A plurality of wafers W are inserted into and housed in each cassette C in a stack manner. Herein, each wafer W is housed in a horizontal position with a wiring pattern face (a surface) thereof being directed upward.

The robot arm 2 of the wafer transport mechanism 3 can move forward and backward horizontally. Moreover, the entire robot arm 2 is driven to turn and move vertically. A wafer holding part 2a is provided at a tip end of the robot arm 2. The wafer holding part 2a is formed into a horseshoe shape and is of a vacuum-suction type. That is, the wafer holding part 2a is inserted between the stacked wafers W housed in the cassette C, and suction-holds the wafer W from a back face of the wafer W. The robot arm 2 pulls out the suction-held wafer W from the cassette C, and transports the wafer W to the alignment stage 4, the chuck table 5 and the wafer supply/collection part 1 in turn.

When the wafer transport mechanism 3 transports the wafer W to the alignment stage 4 and places the wafer W on the alignment stage 4, the alignment stage 4 performs alignment on the wafer W, based on a notch or an orientation flat formed at an outer periphery of the wafer W.

Figure 4:
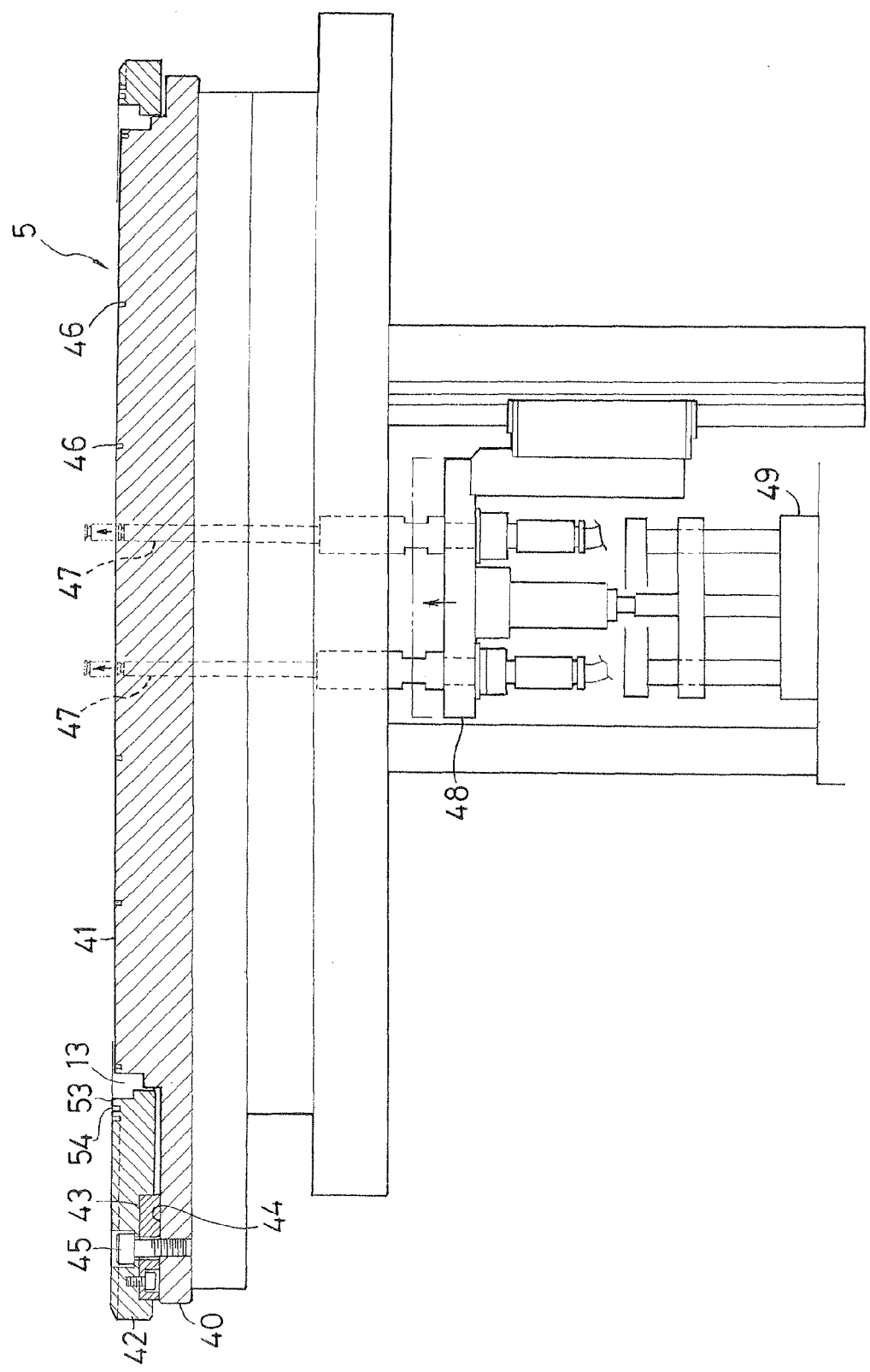
FIG. 4 is a longitudinal sectional side view showing a portion of a chuck table in a vertical direction.
Figure 5:
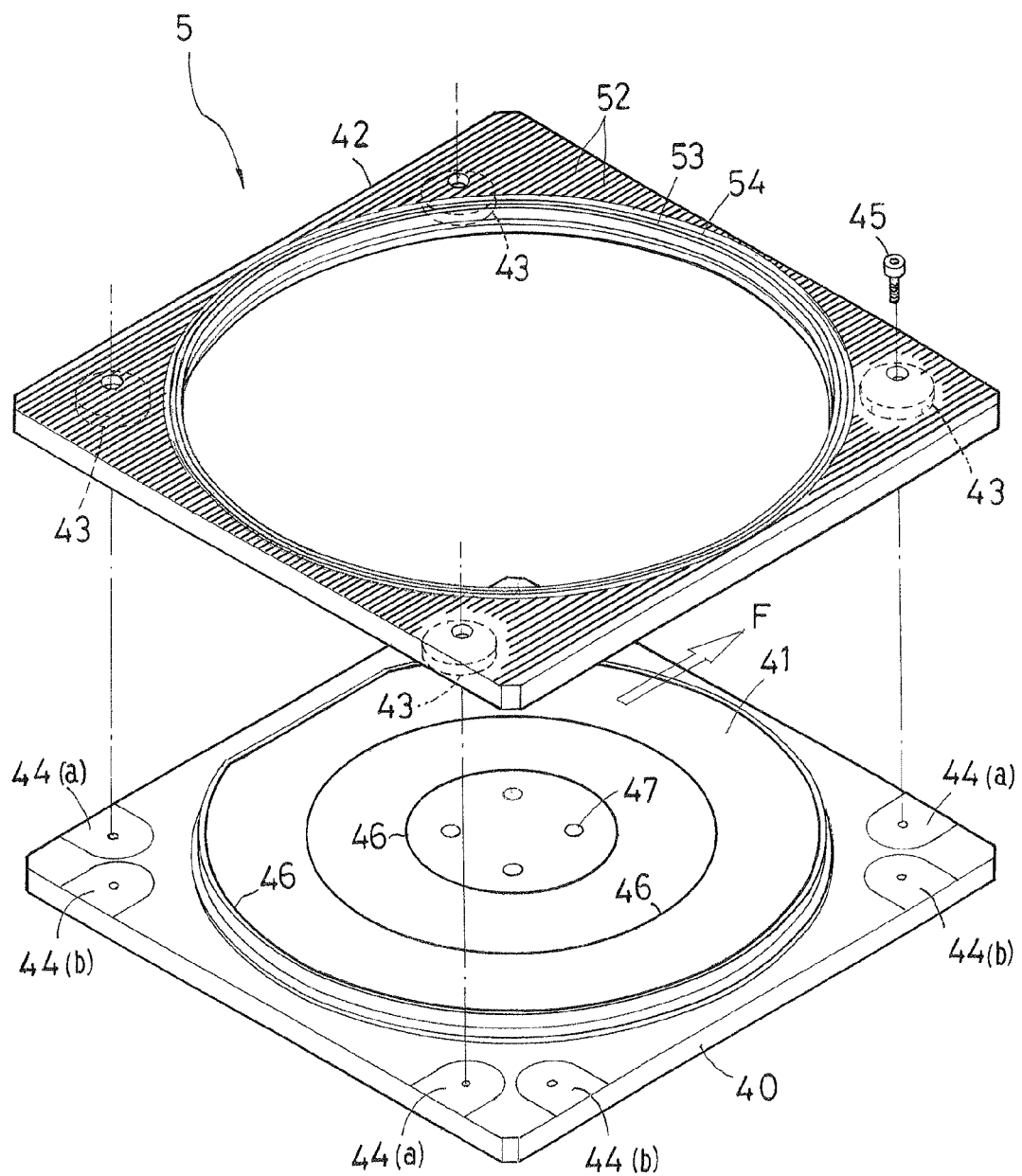
FIG. 5 is an exploded perspective view showing the chuck table.

As shown in FIGS. 4 and 5, the chuck table 5 is configured with a table main body 40 and an annular tape support frame 42. Herein, the table main body 40 has a wafer placement part 41 that holds the wafer W placed thereon. The tape support frame 42 surrounds the wafer placement part 41 and is coupled to the table main body 40. In the chuck table 5, moreover, front, rear, left and right coupling parts 43 are embedded in a bottom face of the tape support frame 42 and are mounted on front, rear, left and right attachment seat parts 44 each formed on a top face of the table main body 40. These coupling parts 43 are fastened to and fixed on the attachment seat parts 44 of the table main body 40 by use of four bolts 45 that penetrate therethrough, respectively. It is to be noted that the chuck table 5 corresponds to a holding table according to this invention.

The coupling part 43 is made of a heat insulating material such as hard resin. It is assumed herein that a heater is incorporated in the table main body 40 and applies heat to the wafer W placed on the wafer placement part 41 in order to increase a protective tape joining strength. In such a case, the coupling part 43 interrupts heat conduction from the table main body 40 to the tape support frame 42. Thus, the coupling part 43 prevents the tape support frame 42 from being subjected to the heat and avoids such a disadvantage that the protective tape T cannot be separated and removed with ease due to the increased protective tape joining strength to the tape support frame 42.

Figure 2:
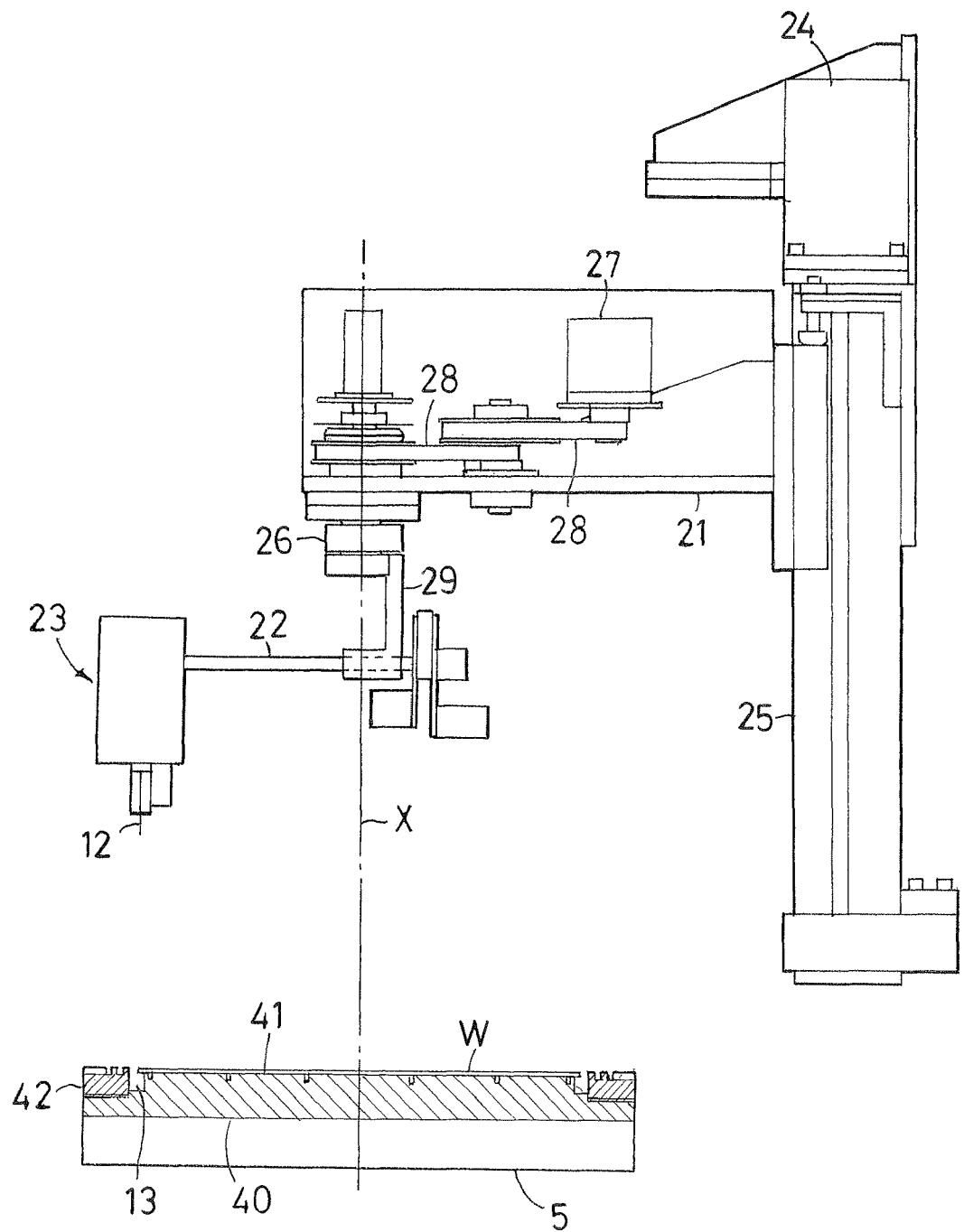
FIG. 2 is a side view showing a general configuration of a tape cutting device.
Figure 6:
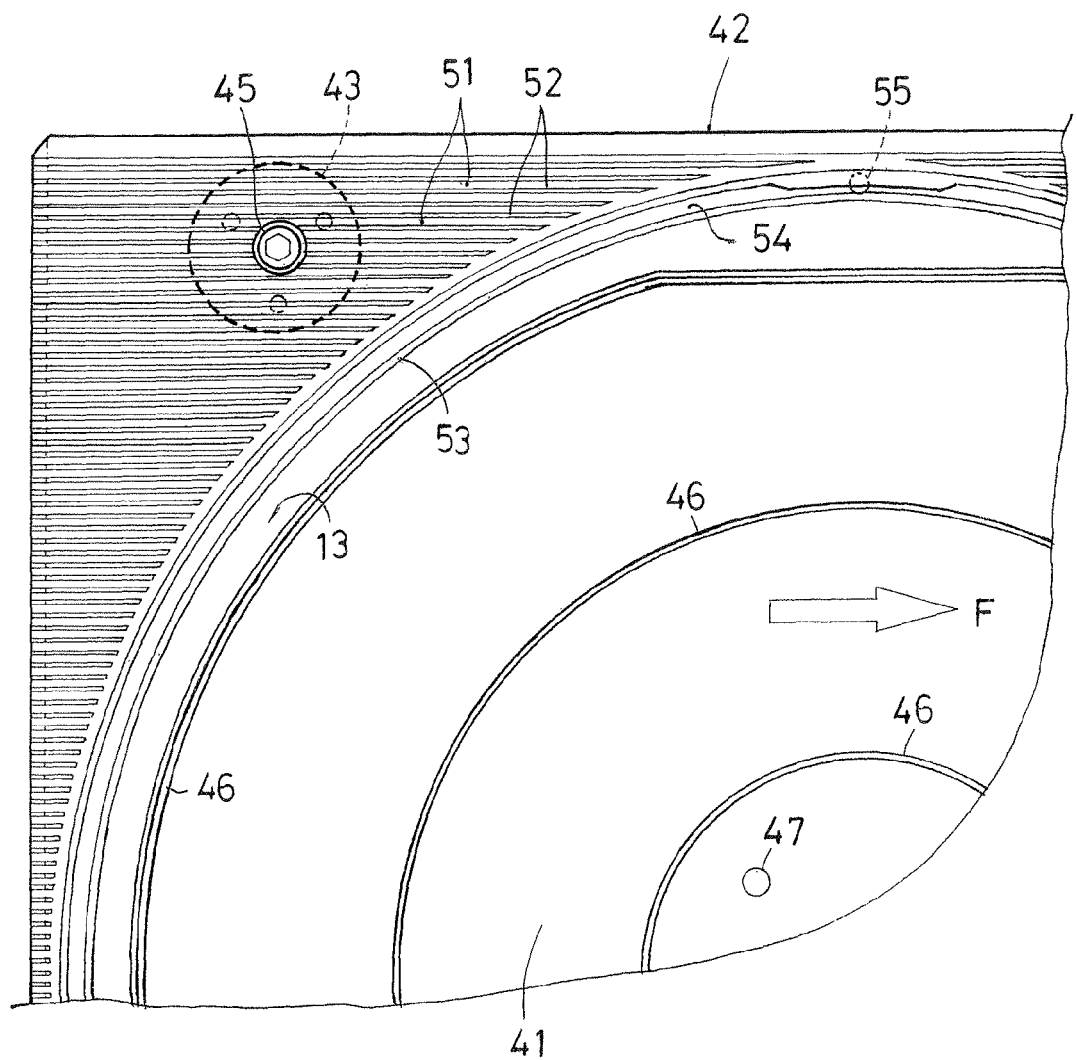
FIG. 6 is a partly enlarged plan view showing the chuck table.

Herein, an inner diameter of the tape support frame 42 is larger than an outer diameter of the wafer placement part 41. As shown in FIGS. 2, 4 and 6, moreover, a cutter blade traveling groove 13 is formed between an outer periphery of the wafer placement part 41 and an inner circumference of the tape support frame 42, and a cutter blade 12 of the protective tape cutting device 9 travels on this cutter blade traveling groove 13 to cut the protective tape T along a contour of the wafer W.

A plurality of vacuum-suction grooves 46 are formed on a top face of the wafer placement part 41 so as to be coaxial with the wafer placement part 41, and suction-hold the wafer W which is transferred from the wafer transport mechanism 3 and then placed on the wafer placement part 41 in a predetermined position. Moreover, four wafer support rods 47 are provided near a center of the wafer placement part 41 so as to move vertically and penetrate through the wafer placement part 41, and protrude upward from the chuck table 5 when the wafer W is placed on or fed out from the wafer placement part 41. Each wafer support rod 47 sucks by vacuum the wafer W placed thereon and, as shown in FIG. 4, is coupled to a movable board 48 disposed below the table main body 40. Accordingly, when the movable table 48 moves vertically by means of a cylinder 49, all the wafer support rods 47 protrude from or retract into the chuck table 5 simultaneously.

Moreover, a plurality of linear grooves 51, a plurality of linear tape support parts 52, an annular tape support part 53 and an annular groove 54 are formed on a top face of the tape support frame 42. Herein, the plurality of linear grooves 51 are arranged in parallel (a tape width direction) along a tape joining direction F (a longitudinal direction). Each linear tape support part 52 is located between the linear grooves 51. The annular tape support part 53 is located outside the cutter blade traveling groove 13. The annular groove 54 surrounds the annular tape support part 53. The annular groove 54 is partly configured as a vacuum-suction groove that communicates with a suction hole 55 at an appropriate position.

The tape support frame 42 is coupled to the table main body 40 such that the top face thereof is higher than the top face of the wafer placement part 41 by a thickness of the wafer W. In other words, a surface height of a wafer placed on the wafer placement part 41 is made equal to a surface height of the linear tape support part 52. As will be described later, moreover, when the tape support frame 42 is attached newly to the table main body 40 while being directed in a reverse direction, the height of the top face of the tape support frame 42 can be changed and adjusted in two ways.

Herein, a surface height of the annular tape support part 53 is also made equal to the surface height of the wafer W placed on the wafer placement part 41.

As shown in FIG. 1, the tape supply part 6 has the following configuration. That is, the protective tape T provided with the separator s is fed out from a supply bobbin 14, and then is guided to and wound around a group of guide rollers 15. When being separated from the separator s, the protective tape T is guided to the joining unit 8. Herein, the supply bobbin 14 is applied with appropriate resistance against its rotation in order to prevent the protective tape T from being fed out excessively.

The separator collection part 7 has the following configuration. That is, a collection bobbin 16 is driven to rotate in a winding direction in order to wind the separator s separated from the protective tape T.

Figure 10:
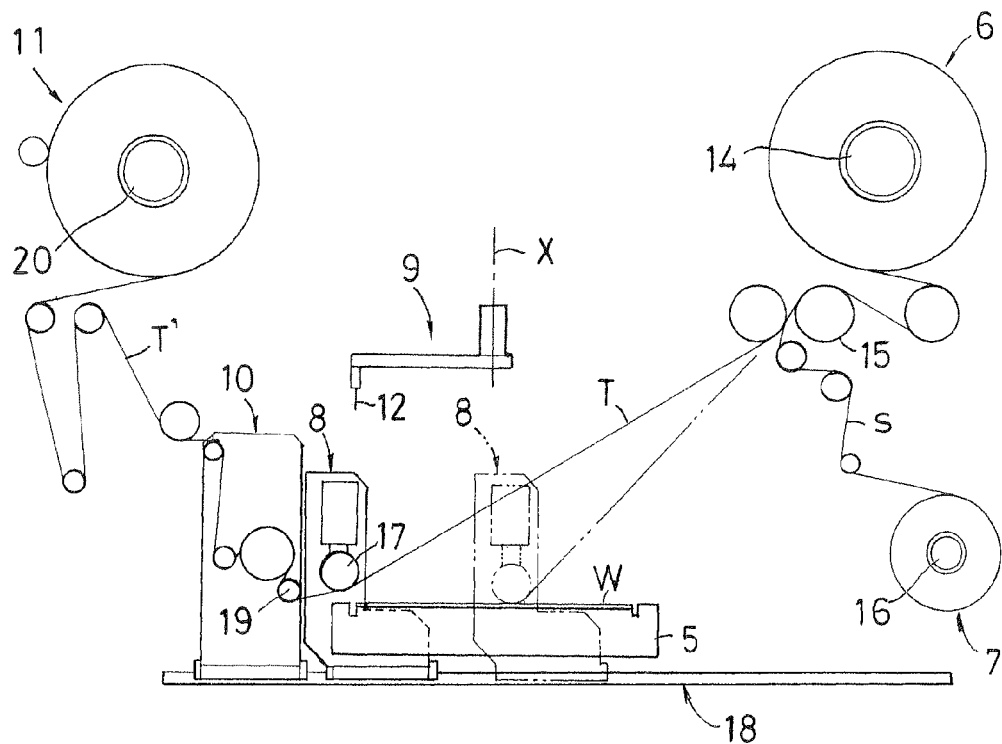
FIGS. 10 to 13 are front views each showing a protective tape joining process.

As shown in FIG. 10, a joining roller 17 is provided horizontally on the joining unit 8 so as to be oriented forward. The joining roller 17 is driven by a slide guide mechanism 18 and a screw-feed type drive mechanism (not shown) to reciprocate horizontally.

Moreover, a separation roller 19 is provided horizontally on the separation unit 10 so as to be oriented forward. The separation roller 19 is also driven by the slide guide mechanism 18 and the screw-feed type drive mechanism (not shown) to reciprocate horizontally.

In the tape collection part 11, a collection bobbin 20 rotates in a winding direction in order to wind the unnecessary tape T'.

As shown in FIG. 2, the tape cutting device 9 has the following configuration. That is, a pair of support arms 22 are arranged in parallel at a lower side of a vertically moving table 21 capable of moving vertically. The pair of support arms 22 can turn about a vertical axis X positioned at a center of the chuck table 5. A cutter unit 23 is provided at a free end of the support arm 22, and the cutter blade 12 is attached to the cutter unit 23 with a nose thereof being directed downward. More specifically, when the support arm 22 turns about the vertical axis X, the cutter blade 12 travels along the outer periphery of the wafer W to cut out the protective tape T.

The vertically moving table 21 moves vertically along an upright frame 25 in a screw-feed manner when a motor 24 rotates forward/backward. A rotation shaft 26 is attached to a free end of the vertically moving table 21 so as to rotate about the vertical axis X and a motor 27 is provided on the vertically moving table 21. The rotation shaft 26 is interlocked with the motor 27 through two belts 28 such that a rotation speed thereof is reduced. In other words, when the motor 27 is actuated, the rotation shaft 26 rotates in a predetermined direction. Further, a support member 29 extends downward from the rotation shaft 26, and the support arm 22 is supported at a lower end of the support member 29 so as to pass through the support member 29. Herein, the support arm 22 can slide horizontally. Accordingly, when the support arm 22 slides horizontally, a length from the vertical axis X to the cutter blade 12 can be changed. In other words, a turning radius of the cutter blade 12 can be adjusted and changed in accordance with a diameter of a wafer.

Figure 3:
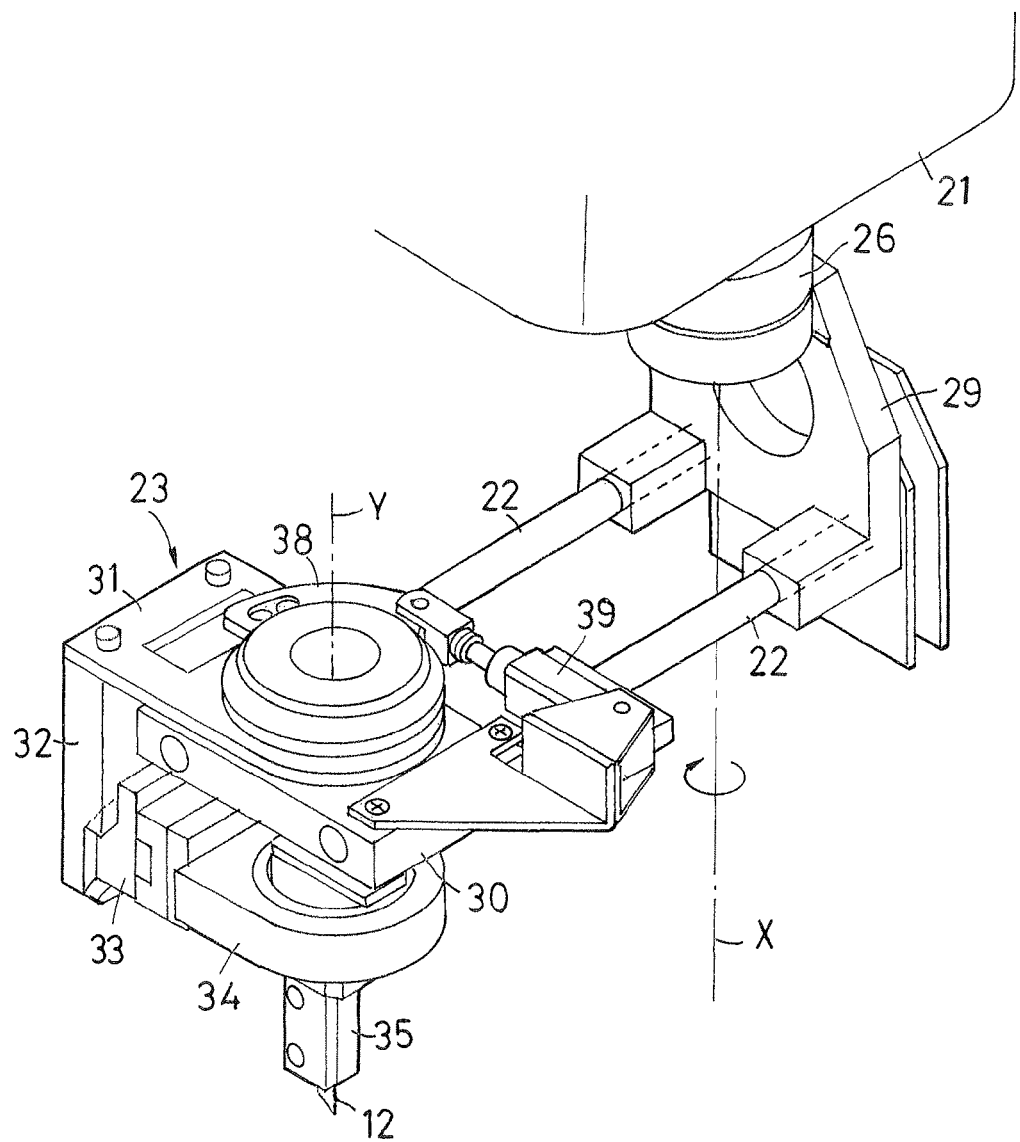
FIG. 3 is a perspective view showing main components of the tape cutting device.

As shown in FIG. 3, a bracket 30 is fixedly attached to the free end of the support arm 22. The cutter unit 23 is attached to and supported with the bracket 30. The cutter unit 23 includes a turning member 31 supported with the bracket 30 so as to turn about a vertical axis Y within a predetermined range, an upright wall-shaped support bracket 32 coupled to a bottom face of an end of the turning member 31, a cutter support member 33 coupled to a side face of the support bracket 32, a bracket 34 supported by the cutter support member 33, a cutter holder 35 attached to the bracket 34, and the like. Herein, the cutter blade 12 is fastened to and fixed on a side face of the cutter holder 35 so as to be exchangeable with new one.

Herein, an operation flange 38 is provided above the turning member 31 and turns together with the turning member 31. The operation flange 38 turns by means of an air cylinder 39, so that the attitude of the entire cutter unit 23 is changed about the vertical axis center Y, with respect to the support arm 22. That is, the actuation of the air cylinder 39 allows adjustment of an angle (a cutting angle) of the cutter blade 12 with respect to the moving direction within a predetermined range.

With reference to FIGS. 10 to 13, next, description will be given of a series of operations for joining the protective tape T to the surface of the wafer W and then cutting the protective tape T with the protective tape joining apparatus according to this invention.

Upon reception of a command to join the protective tape T, first, the robot arm 2 of the wafer transport mechanism 3 moves toward the cassette C mounted on a cassette table, and the wafer holding part 2a is inserted between the wafers W housed in the cassette C. The wafer holding part 2a suction-holds the wafer W from below (i.e., from the back face of the wafer W), feeds out the wafer W from the cassette C, and moves to mount the wafer W to the alignment stage 4.

The alignment stage 4 performs the alignment on the wafer W placed thereon, through use of the notch formed at the outer periphery of the wafer W. Thereafter, the robot arm 2 transfers the wafer W subjected to the alignment from the alignment stage 4 to the chuck table 5, and places the wafer W on the chuck table 5.

The chuck table 5 suction-holds the wafer W placed thereon in the state that the center of the wafer W is located at the center of the chuck table 5. As shown in FIG. 10, herein, the joining unit 8 and the separation unit 10 are at in initial positions on the left side, respectively. Moreover, the cutter blade 12 of the tape cutting device 9 is in an initial position on the upper side.

As shown by an imaginary line in FIG. 10, next, the joining roller 17 of the joining unit 8 moves downward. Then, the joining roller 17 rolls on the protective tape T (in the right direction in FIG. 10) from the linear tape support part 52 at a side to start the joining of the protective tape T to the linear tape support part 52 at a side to terminate the joining of the protective tape T with the wafer placement part 41 being interposed therebetween while pressing the protective tape T downward against the wafer W. That is, the joining roller 17 rolls on the surface of the linear tape support part 52 and the surface of the annular tape support part 53, each of which is equal in height to the surface of the wafer W, to pass the surface of the wafer W. Thus, the protective tape T is joined to the entire surface of the wafer W and the top face of the tape support frame 42 of the chuck table 5.

Herein, the plurality of linear tape support parts 52 are formed along the joining roller rolling and moving direction. Upon joining of the protective tape T onto the top face of the tape support frame 42, therefore, the joining roller 17 rolls smoothly on the protective tape T without getting caught in the linear groove 51 located between the linear tape support parts 52. Thus, the protective tape T is joined to and supported by the surfaces of the plurality of linear tape support parts 52 and the surface of the annular tape support part 53.

After completion of the tape joining operation, a negative pressure is applied to the annular groove 54, so that the protective tape T on the annular groove 54 is sucked into the annular groove 54 by action of vacuum suction. Accordingly, the protective tape T is pressed strongly against the annular tape support part 53, and tension is applied reliably and uniformly to the protective tape T at the entire circumference of the cutter blade traveling groove 13.

Figure 11:
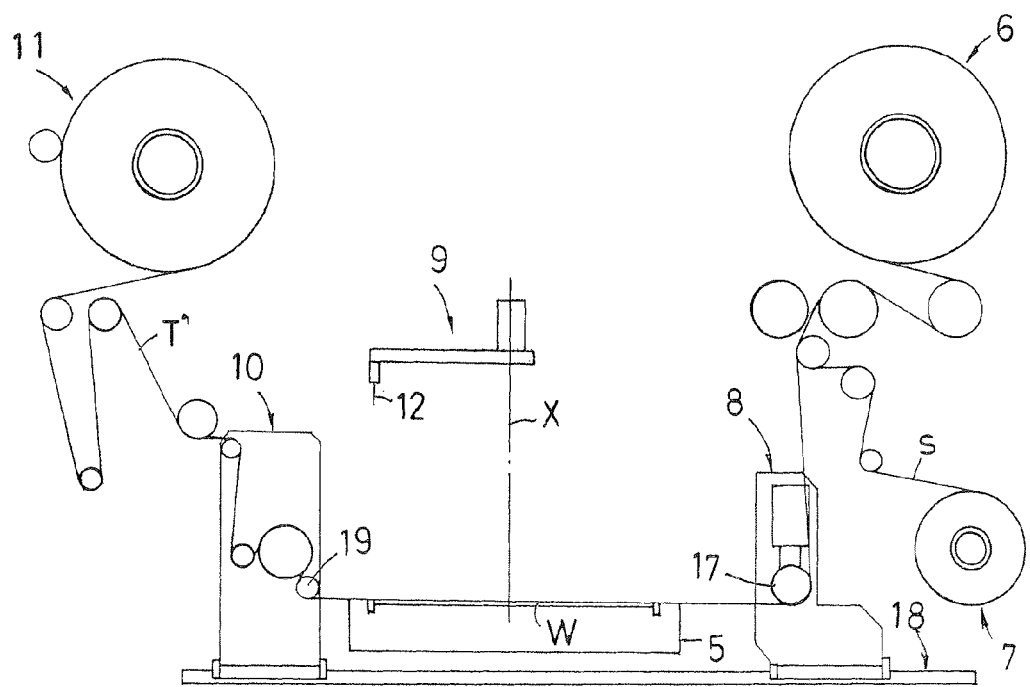

As shown in FIG. 11, when the joining unit 8 arrives at a terminal position, the cutter blade 12 moves downward, so that the protective tape T on the cutter blade traveling groove 13 of the chuck table 5 is pierced with the cutter blade 12.

Figure 12:
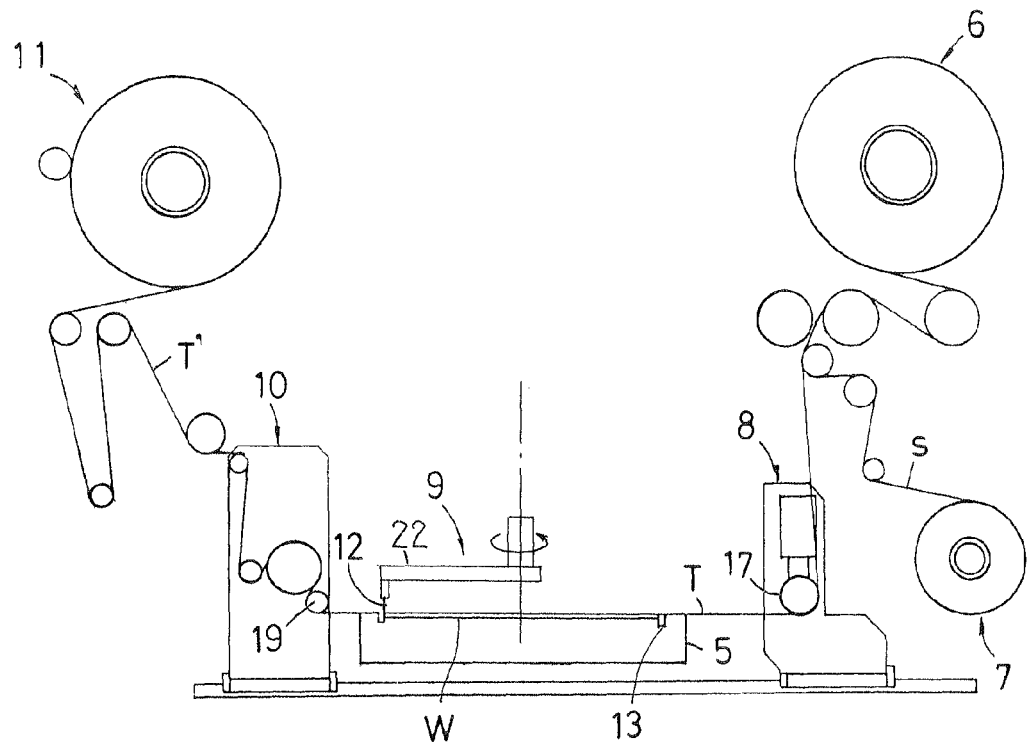

As shown in FIG. 12, next, the support arm 22 rotates, so that the cutter blade 12 turns while coming slide into contact with an outer peripheral edge of the wafer W to cut the protective tape T along the outer periphery of the wafer W.

Figure 13:
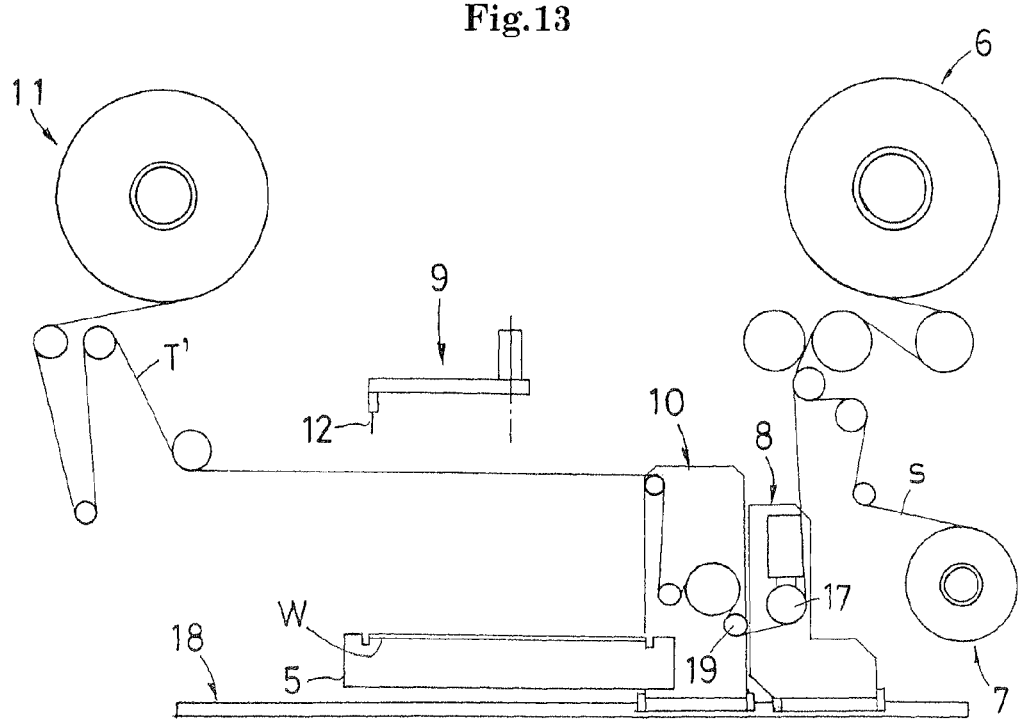

After completion of the operation of cutting the protective tape T along the outer periphery of the wafer W, as shown in FIG. 13, the cutter blade 12 moves upward and returns to the standby position. Next, the separation unit 10 moves forward and separates the unnecessary tape T' after cut out on the wafer W, and joined to be supported on the tape support frame 42, while lifting up the unnecessary tape T'.

In this case, a contact area of the protective tape T with the plurality of linear tape support parts 52 of the tape support frame 42 is smaller than an area of the tape support frame 42. Moreover, the protective tape T is joined in a strip shape to the tape support frame 42 in the tape joining direction F. Therefore, the unnecessary tape T' after cut out can be separated and removed from the tape support frame 42 with ease by the following manner. That is, the unnecessary part T' is lifted up in the tape joining direction F starting from a joining start position.

When the separation unit 10 arrives at a separation completion position, the separation unit 10 and the joining unit 8 recede and return to the initial positions, respectively. Herein, the collection bobbin 20 winds the unnecessary tape T' and the tape supply part 6 feeds out the adhesive tape T in a given amount.

When the forgoing tape joining operation is completed, the chuck table 5 releases the suction-holding of the wafer W. Then, the wafer holding part 2a of the robot arm 2 moves to mount the wafer W subjected to the tape joining processing from the chuck table 5 to the wafer supply/collection part 1, and inserts the wafer W into the cassette C.

Thus, the series of operations, that is, a tape joining process is completed. Thereafter, the foregoing operations are performed on each new wafer W in succession.

In the tape joining process described above, settings for the chuck table 5 must be adjusted such that the surface of the wafer W placed on the wafer placement part 41 is flush with the top face of the tape support frame 42. In the protective tape joining apparatus according to this embodiment, the height of the tape support frame 42 is adjusted as follows in accordance with change in thickness of a wafer W to be handled herein.

Figure 7:
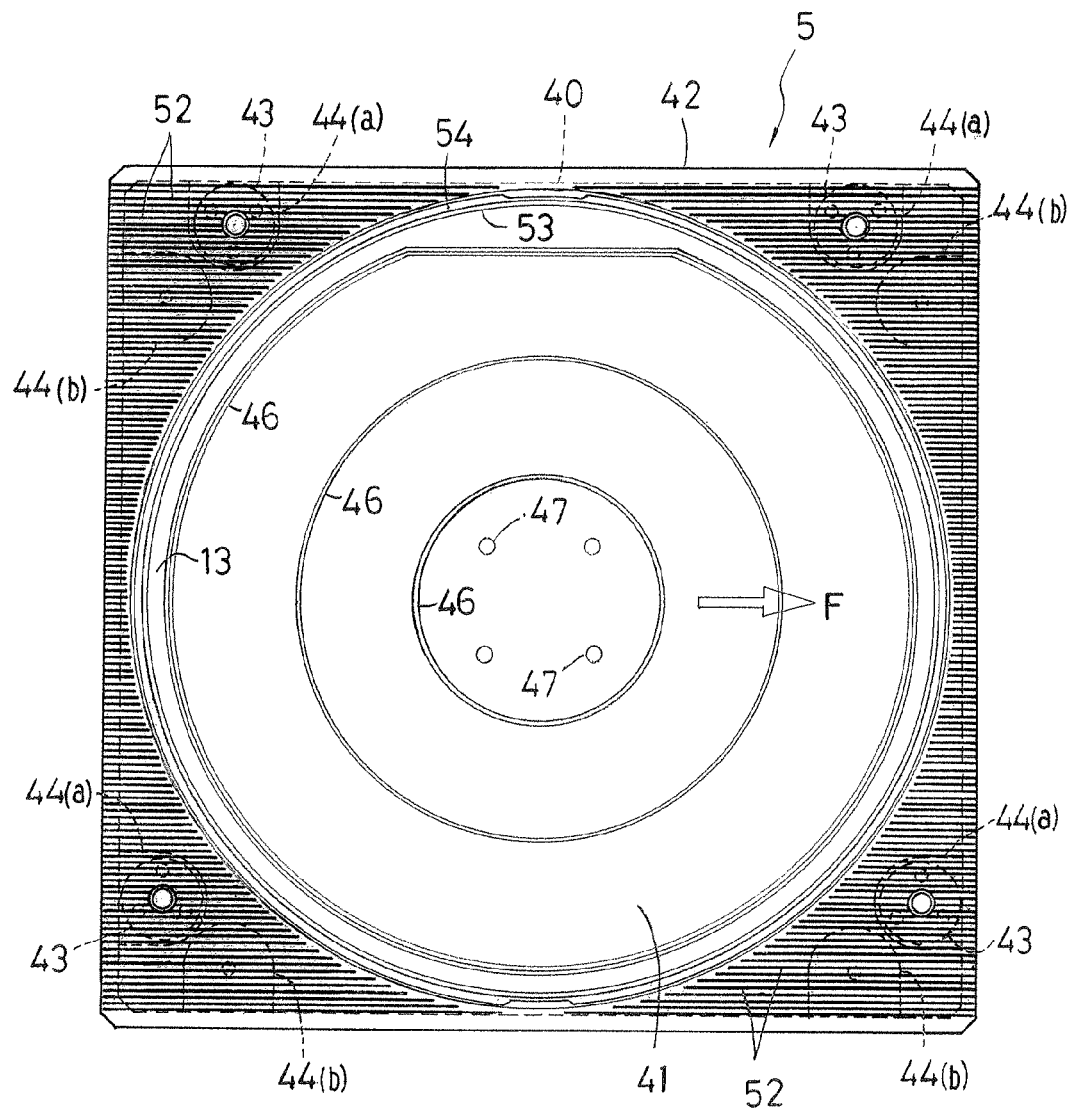
FIG. 7 is a plan view showing the chuck table.

The coupling parts 43 are provided in the areas of four corners on the bottom face of the tape support frame 42. A pair of upper coupling parts 43 are asymmetric to a pair of lower coupling parts 43. As shown in FIG. 7, the set of coupling parts 43, which are equal in height to each other, are provided at a front left side and a rear left side of the table main body 40 (an upper side in FIG. 7) in the tape joining direction F. The different set of coupling parts 43, which are equal in height to each other, are provided at a front right side and a rear right side of the table main body 40 (a lower sides in FIG. 7) in the tape joining direction F.

Figure 9A:
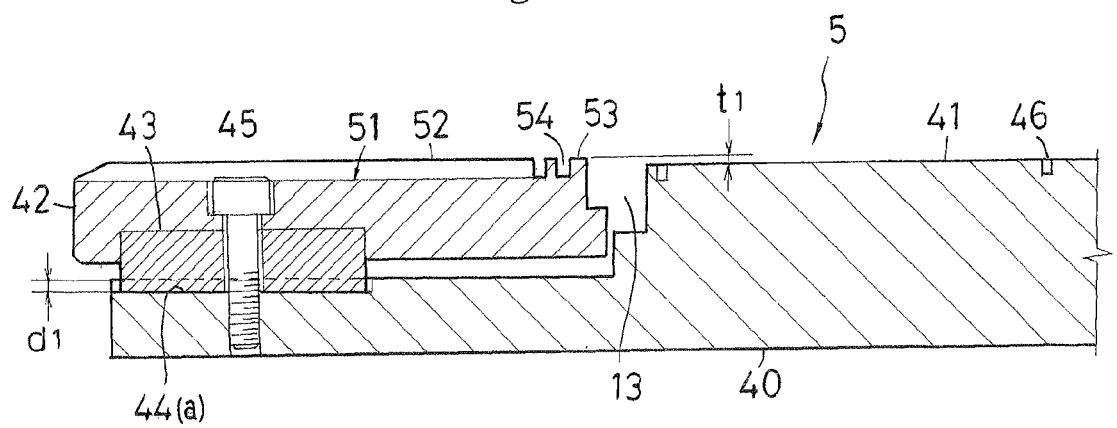
FIGS. 9A and 9B are longitudinal sectional views each showing a height adjusting structure of the tape support frame.
Figure 9B:
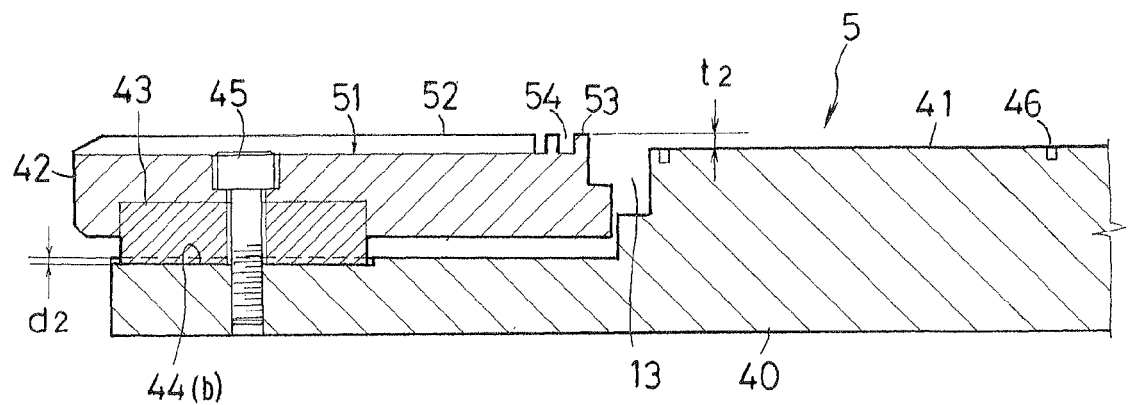

Moreover, the attachment seat parts 44 formed on the table main body 40 such that these coupling parts 43 are mounted thereon, respectively, are provided in two sets in correspondence with the respective coupling parts 43 of the tape support frame 42 which is directed in a reverse direction. As shown in FIGS. 9A and 9B, each attachment seat part 44(*a*) has a depth d1 and each attachment seat part 44(*b*) has a depth d2. Herein, the depth d1 is different from the depth d2.

Figure 8:
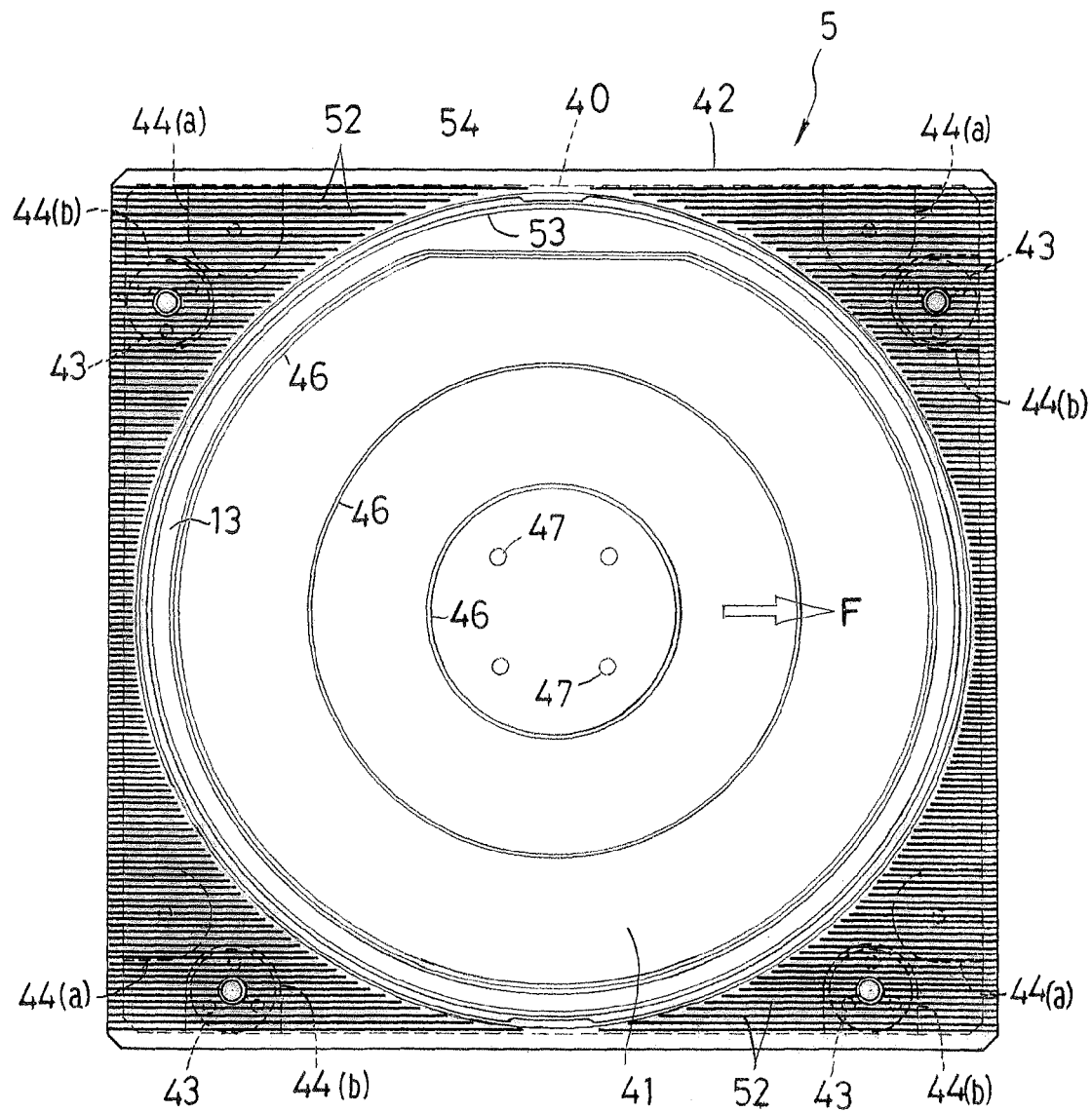
FIG. 8 is a plan view showing the chuck table to which a tape support frame is attached while being directed in a reverse direction.

Accordingly, in the state that the tape support frame 42 is coupled as shown in FIG. 7, the coupling parts 43 are coupled to the attachment seat parts 44(*a*) each having the large depth, respectively, as shown in FIG. 9A, so that a difference t1 in height between the top face of the wafer placement part 41 and the top face of the tape support frame 42 becomes small. Thus, the chuck table 5 can handle a wafer W having a small thickness. On the other hand, in the state that the tape support frame 42 is coupled while being directed in the reverse direction as shown in FIG. 8, the coupling parts 43 are coupled to the attachment seat parts 44(*b*) each having the small depth, respectively, as shown in FIG. 9B, so that a difference t2 in height between the top face of the wafer placement part 41 and the top face of the tape support frame 42 becomes larger than the difference t1. Thus, the chuck table 5 can handle a wafer W having a larger thickness than the wafer mentioned above.

In the protective tape joining apparatus according to this embodiment, the contact area of the protective tape T with the plurality of linear tape support parts 52 of the tape support frame 42 is smaller than the area of the tape supply frame 42. Further, the protective tape T is joined and supported such that the joining surfaces thereof are arranged in parallel in one direction to form a linear shape.

Accordingly, the cut protective tape T is separated starting from one end of the linear shape, that is, the joining starting position or the joining termination position. Thus, the protective tape T can be separated and removed from the tape support frame 42 with ease.

At the outer side of the cutter blade traveling groove 13, further, the protective tape T is continuously joined to and supported by the annular tape support part 53 of the tape support frame 42 so as to surround the outer periphery of the wafer W. Therefore, the protective tape T on the cutter blade traveling groove 13 is in such a state that tension is applied thereto uniformly throughout the circumference of the cutter blade traveling groove 13. In the tape cutting process, accordingly, the protective tape T, to which the tension is applied uniformly, is cut by the cutter blade 12 traveling on the cutter blade traveling groove 13 uniformly without being shifted.

Further, when the tape support frame 42 is directed in the reverse direction relative to the tape joining direction F, the height from the surface of the wafer placement part 41 to the surface of the tape support frame 42 can be changed and adjusted. That is, only the height can be changed readily without changing conditions in the case where the protective tape T is joined and separated. Accordingly, there is no need to prepare and store previously a plurality of tape support parts 42 depending on types of protective tapes T and thicknesses of wafers W. Thus, the single tape support frame 42 is applicable to wafers with various thicknesses.

Herein, the joining roller 17 rolls on only the top face of the linear tape support part 52 without repetitive ascent from the linear groove 51 to the linear tape support part 52 and descent from the linear tape support part 52 to the linear groove 51.

Accordingly, the protective tape T can be joined to the linear tape support part 52 while tension to be applied to the protective tape T is kept uniformly.

In addition to the foregoing embodiment, this invention may be embodied variously as follows.

Figure 14:
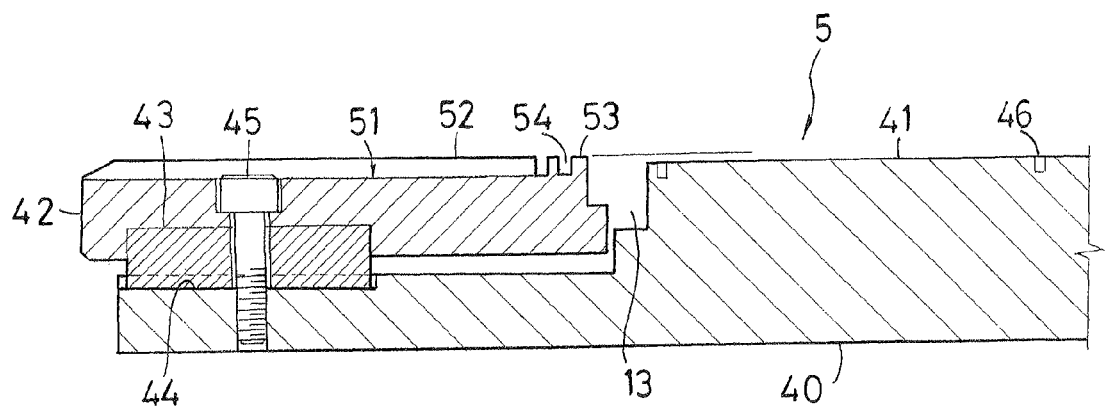
FIGS. 14 and 15 are longitudinal sectional views each showing another height adjusting structure of the tape support frame.
Figure 15:
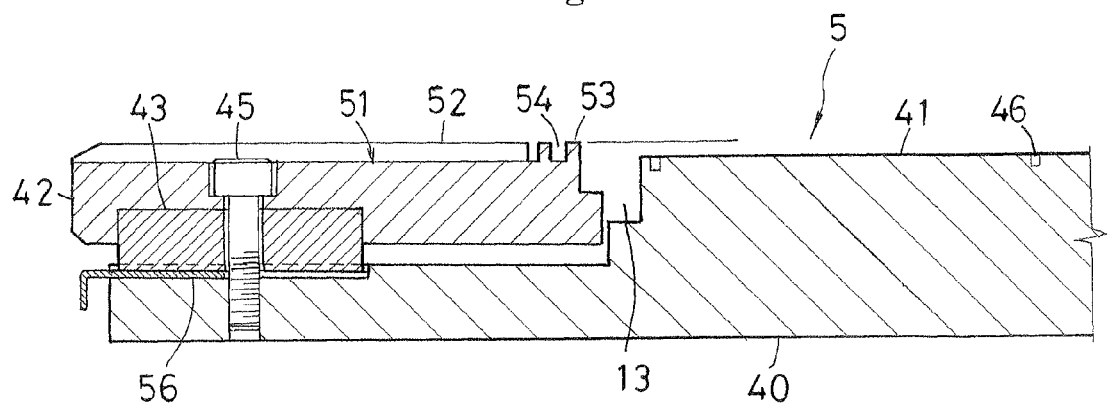
Figure 16:
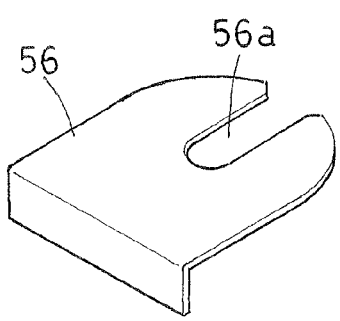
FIG. 16 is a perspective view showing a shim plate.

(1) As shown in FIGS. 14 and 15, a shim plate 56 is inserted or removed from between the coupling part 43 and the attachment seat part 44, which allows adjustment in height of the tape support frame 42. As shown in FIG. 16, in this case, a slit 56*a* is formed on the shim plate 56 such that the bolt 45 passes therethrough, so that the shim plate 56 can be inserted or removed without removal of the bolt 45.

(2) In the foregoing embodiment, the cutter blade 12 turns and travels relative to the fixed chuck table 5, but this invention is not limited thereto. For example, the position of the cutter blade 12 is fixed and the chuck table 5 is allowed to turn, so that the cutter blade 12 can travel relatively on the cutter blade traveling groove 13.

(3) In the foregoing embodiment, the single annular tape support part 53 is formed, but this invention is not limited thereto. For example, a plurality of annular tape support parts 53 may be formed.

The present invention may be embodied in other specific forms without departing from the spirit or essential attributes thereof and, accordingly, reference should be made to the appended claims, rather than to the foregoing specification, as indicating the scope of the invention.

What is claimed is:

1. A protective tape joining apparatus comprising:
   a holding table having a cutter blade traveling groove and holding a semiconductor wafer placed thereon;
   a joining roller rolling on a protective tape to join the protective tape to a surface of the semiconductor wafer; and
   a cutter blade piercing through the protective tape, traveling on the cutter blade traveling groove along an outer periphery of the semiconductor wafer, and cutting the protective tape joined to the surface of the semiconductor wafer along a contour of the semiconductor wafer,
   wherein the holding table includes
   a table main body having a wafer placement part holding the semiconductor wafer placed thereon, and
   an annular tape support frame provided outside the wafer placement part with the cutter blade traveling groove being interposed therebetween, and
   the tape support frame has, at a top face thereof,
   a plurality of linear grooves arranged in parallel in a tape joining direction,
   a plurality of linear tape support parts each located between the linear grooves, and
   an annular tape support part supporting the protective tape at an outer side of the cutter blade traveling groove,
   wherein
   the tape support frame is coupled to the table main body such that a height thereof is adjustable relative to the wafer placement part,
   the table main body has two sets of attachment seat parts which are different in height from each other,
   the tape support frame has coupling parts mounted on and coupled to the attachment seat parts, respectively, and when the tape support frame is directed in a reverse direction relative to the joining roller rolling direction, the coupling parts face one of the two sets of attachment seat parts.

2. The protective tape joining apparatus according to claim 1, wherein
an annular groove is formed outside the annular tape support part as a vacuum-suction groove.

3. The protective tape joining apparatus according to claim 1, wherein
the coupling part of the tape support frame is made of a heat insulating material and is different in material from the tape support frame.

4. The protective tape joining apparatus according to claim 1, wherein
the holding table further includes a shim plate to be inserted between the coupling part and the attachment seat part which are coupled by a bolt, and
the shim plate has a slit through which the bolt penetrates when the shim plate is inserted between the coupling part and the attachment seat part.

* * * * *